(12) United States Patent
Tsai et al.

(10) Patent No.: US 8,363,477 B2
(45) Date of Patent: Jan. 29, 2013

(54) METHOD OF SETTING TRIM CODES FOR A FLASH MEMORY AND RELATED DEVICE

(75) Inventors: Yu-Hsiung Tsai, Hsinchu (TW);
Chih-Bin Kuo, Miaoli County (TW);
Chiun-Chi Shen, Hsinchu County (TW)

(73) Assignee: eMemory Technology Inc., Hsinchu Science Park, Hsin-Chu (TW)

( * ) Notice: Subject to any disclaimer, the term of this patent is extended or adjusted under 35 U.S.C. 154(b) by 203 days.

(21) Appl. No.: 13/044,458

(22) Filed: Mar. 9, 2011

(65) Prior Publication Data

US 2012/0230109 A1    Sep. 13, 2012

(51) Int. Cl.
*G11C 16/04* (2006.01)
(52) U.S. Cl. ......... 365/185.18; 365/185.23; 365/185.33; 365/189.09
(58) Field of Classification Search .................. None
See application file for complete search history.

(56) References Cited

U.S. PATENT DOCUMENTS

| 5,682,346 | A | * | 10/1997 | Yamamura et al. | ...... 365/185.18 |
| 6,785,163 | B2 | * | 8/2004 | Yeh et al. | .................... 365/185.2 |
| 7,457,178 | B2 | * | 11/2008 | Tu et al. | ......................... 365/201 |
| 7,948,801 | B2 | * | 5/2011 | Cho | .......................... 365/185.18 |
| 7,961,517 | B2 | * | 6/2011 | Aritome | ................... 365/185.18 |

* cited by examiner

*Primary Examiner* — Tan T. Nguyen
(74) *Attorney, Agent, or Firm* — Winston Hsu; Scott Margo

(57) ABSTRACT

A flash memory device with auto-trimming functionality includes a memory cell array comprising first memory cells and a fuse sector, a read circuit for reading a memory state of the first memory cells, an offset circuit for outputting offset current values, and an auto-trimming circuit. The auto-trimming circuit has a register for storing a current characteristic, a current control module for modifying input current applied to a first memory cell under test at a first address according to the memory state, and updating the current characteristic to the modified input current, an address counter for starting application of the modified input current to a second memory cell at a second address for test when reading the first memory cell passes, and a programming circuit for programming the fuse sector according to the current characteristic and the offset current values.

28 Claims, 3 Drawing Sheets

METHOD OF SETTING TRIM CODES FOR A FLASH MEMORY AND RELATED DEVICE

BACKGROUND OF THE INVENTION

1. Field of the Invention

The present invention relates to flash memory testing, and more particularly to a method of automatically setting trim codes for a flash memory and related device.

2. Description of the Prior Art

Flash memory devices are programmed, read, and erased by a relatively high voltage compared to a normal operating voltage. The high voltage is generated by a voltage regulator, which acts as a direct current to direct current (DC-DC) converter. Due to process variation of a semiconductor fabrication process for fabricating the voltage regulator, the high voltage may not be generated accurately, which would affect performance of the flash memory device. Thus, the flash memory device includes a fuse cell array for performing trimming on the high voltage generated by the voltage regulator.

The fuse cell array has at least two disadvantages. First, the fuse cell array can only be set one time, which reduces flexibility. Second, dies of the flash memory device must be tested one-at-a-time.

SUMMARY OF THE INVENTION

According to an embodiment, a flash memory device with auto-trimming functionality comprises a memory cell array, a read circuit, an offset circuit, and an auto-trimming circuit. The memory cell array comprises a plurality of first memory cells, and a fuse sector comprising a plurality of second memory cells. The read circuit is electrically connected to the plurality of first memory cells for reading a memory state of the plurality of first memory cells. The offset circuit is for outputting offset current values according to an input current value. The auto-trimming circuit comprises a register, a current control module, an address counter, and a programming circuit. The register is for storing a current characteristic. The current control module is for modifying an input current applied to a first memory cell of the plurality of first memory cells under test at a first address according to the memory state, and updating the current characteristic to the modified input current. The address counter is for starting application of the modified input current to a second memory cell of the plurality of first memory cells at a second address for test when reading the first memory cell passes. The programming circuit is for transmitting the current characteristic to the offset circuit when the current control module updates the current characteristic to a limit input current or all of the plurality of memory cells have been read, receiving the offset current values from the offset circuit, and programming the fuse sector according to the current characteristic and the offset current values.

According to an embodiment, a method of setting trim codes for a flash memory device comprises setting a plurality of memory cells of the flash memory device to an initial state, applying an input current to a first memory cell of the plurality of memory cells at a first address, modifying the input current until read pass occurs under the initial state, updating a current characteristic with the first input current each time the input current is modified, and setting the trim codes according to the current characteristic when all memory cells of the plurality of memory cells have been read.

According to another embodiment, a flash memory device with auto-trimming functionality comprises a memory cell array, a read circuit and an auto-trimming circuit. The memory cell array comprises a plurality of memory cells which are fully erased or fully programmed and a fuse sector. The read circuit is electrically connected to the memory cells for reading the memory cells and outputting a cell distribution. And, the auto-trimming circuit is for modifying an input characteristic according to the cell distribution and outputting trim codes to the fuse sector according to the input characteristic and a plurality of offset current values.

These and other objectives of the present invention will no doubt become obvious to those of ordinary skill in the art after reading the following detailed description of the preferred embodiment that is illustrated in the various figures and drawings.

DETAILED DESCRIPTION

For a method of setting trim codes for a flash memory device, the method may be performed following a first trimming operation. The first trimming operation may be utilized for performing reference current trimming and/or control line voltage trimming to generate a first set of trim codes. The first set of trim codes may be utilized to overcome effects of process variation on programming voltage Vppzcl and/or reference current Iref. The first trimming operation may be performed on a die-by-die basis.

Figure 1:
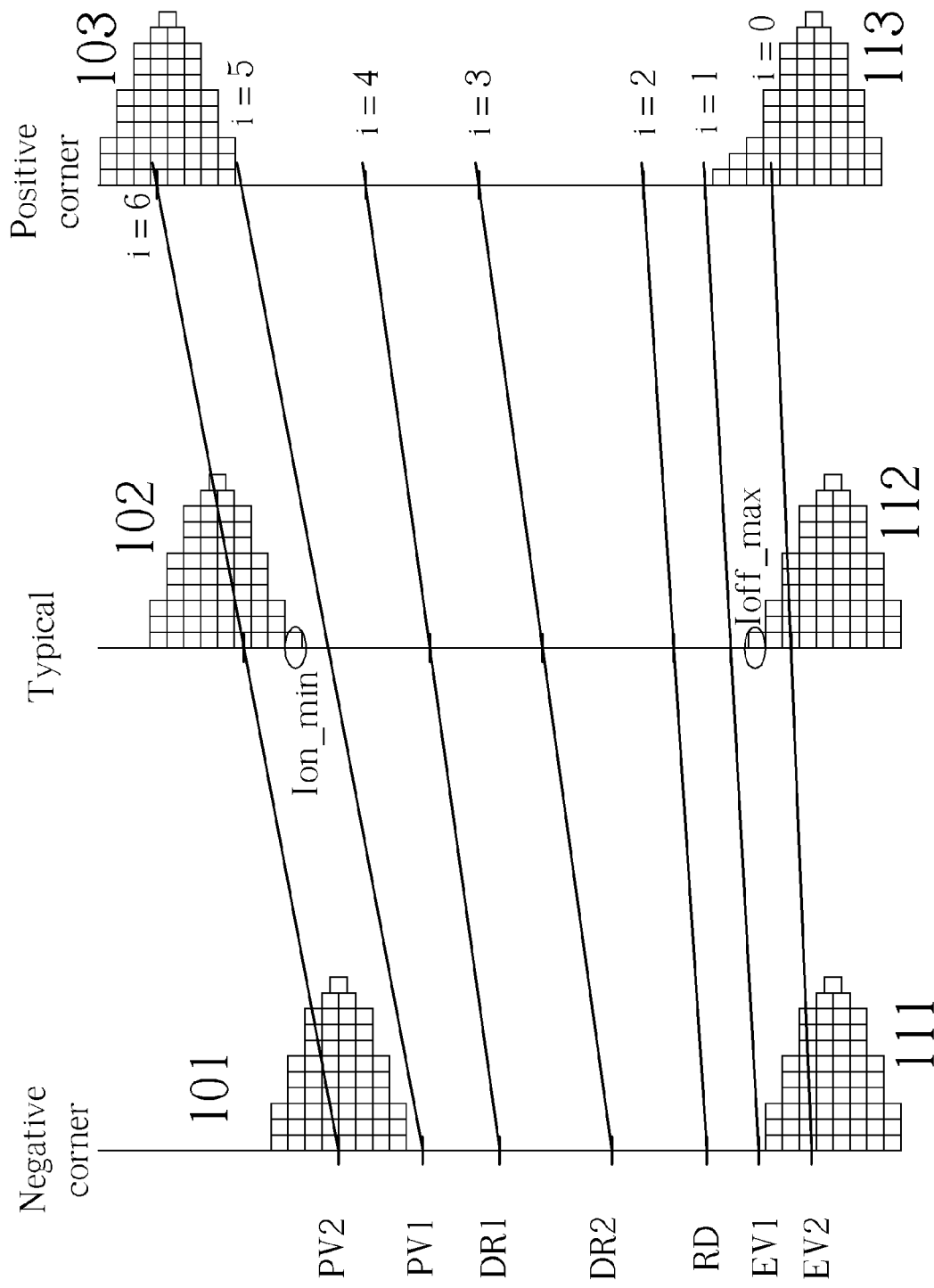
FIG. 1 is a diagram illustrating various currents of a memory die, and memory cell distributions for program verify and erase margin read currents for typical, negative, and positive process corners.

Please refer to FIG. 1, which is a diagram illustrating various currents of a memory die, and memory cell distributions 101-103, 111-113 respectively for program verify and erase margin read currents for typical, negative, and positive process corners. The method of setting trim codes may be utilized for generating and storing sets of second trim codes, each set of second trim codes corresponding to a die of the flash memory device. As shown in FIG. 1, a set of test currents, including at least one program verify current PV1, PV2, at least one data retention verify current DR1, DR2, a read verify current RD, and at least one erase verify current EV1, EV2, are specified for each memory cell of each die. FIG. 1 shows the memory cell distributions 101-103, 111-113 for the program verify current PV and the erase verify current EV2 at negative, typical, and positive corners, respectively. For programming, a minimum on current Ion_min may be a key parameter for ensuring that each die passes test. For erase, a maximum off current Ioff_max may be a key parameter for ensuring that each die passes test.

Figure 2:
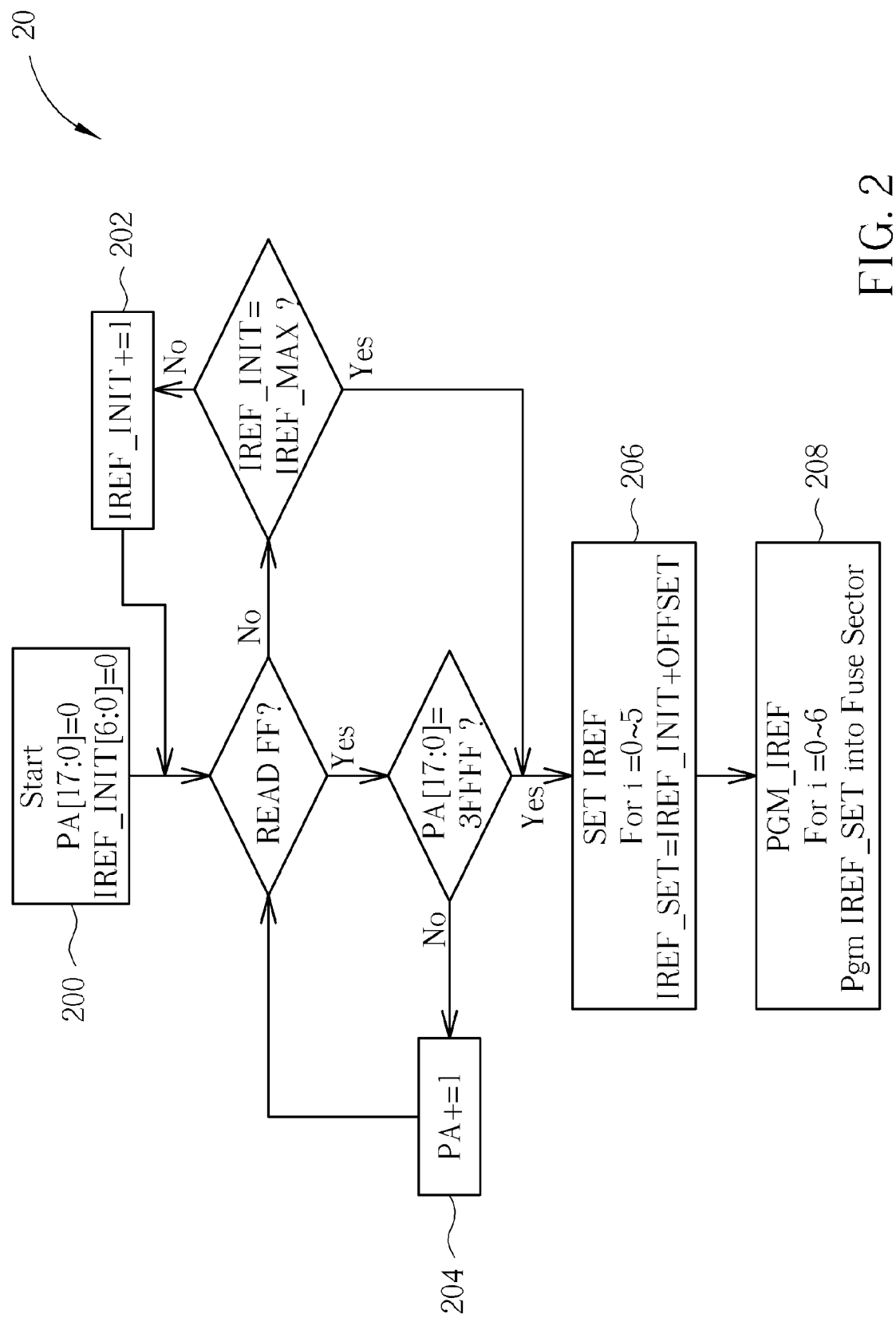
FIG. 2 is a flowchart of a process for performing auto-trimming according to an embodiment.

Taking a single die as an example, distribution of the erase verify current EV2 for each memory cell may be obtained by using a process 20 shown in FIG. 2. The process 20 is illustrated for a 256 kb die. After completing a full chip erase on the single die, the process 20 starts at a $0^{th}$ cell at address PA[17:0]=0 (Step 200). An initial reference current IREF_INIT[6:0]=0 is applied as the erase verify current EV2 for the $0^{th}$ cell. If an erase state "FF" is not read from the $0^{th}$ cell, the initial reference current IREF_INIT[6:0] is incremented by one resolution (Step 202) to IREF_INIT[6:0]=1. Here one resolution is 1 uA, for example. Step 202 is performed iteratively, incrementing the initial reference current IREF_INIT until the erase state "FF" is read or a maximum initial reference current IREF_MAX (IREF_INIT[6:0]=63) is reached. If the maximum initial reference current IREF_MAX is not reached before the erase state "FF" is read, the $0^{th}$ cell passes, and the process 20 increments the address (Step 204) to the $1^{st}$ cell at address PA[17:0]=1, and applies the current initial reference current IREF_INIT, e.g. IREF_INIT[6:0]=1, to the $1^{st}$ cell. If the erase state "FF" is read, the process 20 continues to the next cell. Else, the initial reference current IREF_INIT is incremented until the erase state "FF" is read, or the maximum initial reference current IREF_MAX is reached. Once the process 20 has tested every cell in the die, or if at any time the maximum initial reference current IREF_MAX is reached, the process 20 continues to Step 206.

In Step 206, reference current settings IREF_SET are set according to the current initial reference current IREF_INIT after all cells have been tested or the maximum initial reference current IREF_MAX has been reached. As shown in FIG. 1, seven different currents (i=0 to i=6) may be set based on the reference current obtained through Steps 200 to 204. Assuming the process 20 is utilized to determine the maximum off current Ioff_max of the erase verify current EV2 (i=0), the erase verify current EV1 (i=1), the read verify current RD (i=2), the at least one data retention verify current DR1, DR2 (i=3, i=4), and the program verify currents PV1 (i=5), PV2 (i=6) may be set by adding corresponding offsets to the maximum off current Ioff_max obtained. The offsets may be calculated according to a formula based on process corner (negative, typical, positive) and the maximum off current Ioff_max. The offsets may be stored in a look-up table. For example, a look-up table may include reference current settings IREF_SET corresponding to process corner (negative, typical, positive), and maximum off current Ioff_max. For example, the erase verify current EV1 (i=1) may be calculated as a predetermined percent higher than the maximum off current Ioff_max. The predetermined percent may be different for each process corner, and may differ for each reference current setting IREF_SET.

Figure 3:
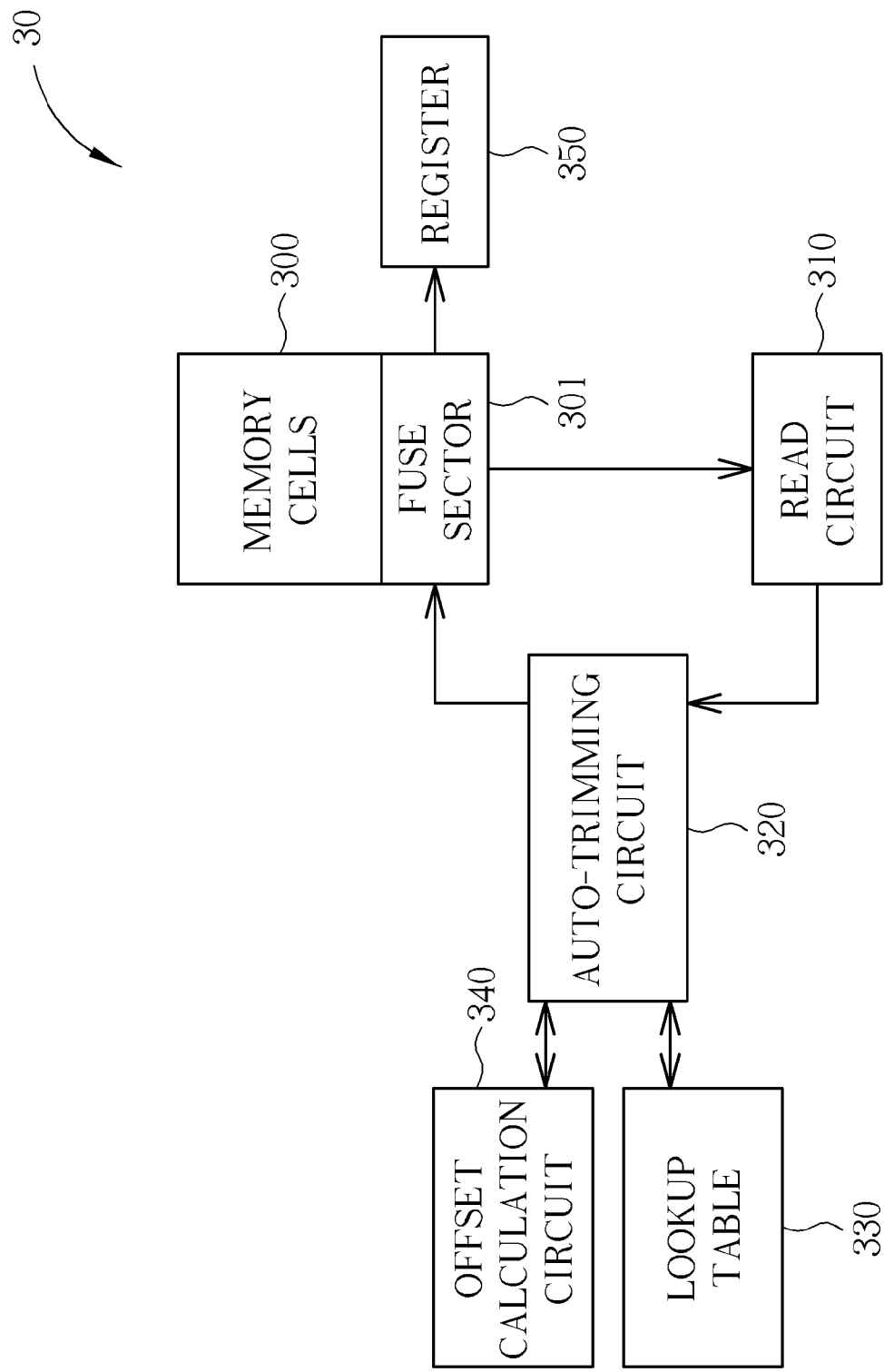
FIG. 3 is a diagram of a flash memory device according to an embodiment.

In Step 208, the reference current settings IREF_SET are programmed into a fuse sector of the flash memory device. Referring to FIG. 3, which is a diagram of a flash memory device 30 according to an embodiment, a fuse sector 301 of the flash memory device 30 may be part of an array of memory cells 300. The fuse sector 301 may comprise memory cells having identical structure as the memory cells 300. Thus, in Step 208, in terms of the flash memory device 30 of FIG. 3, the reference current settings IREF_SET corresponding to the memory cells 300 may be programmed to the fuse sector 301.

In the above, use of 64 different initial reference currents IREF_INIT and a 256 kb die is for illustrative purposes only. The process 20 is not limited thereto, and may be utilized for fewer or more memory cells and/or initial reference currents IREF_INIT. Configuration of the initial reference currents IREF_INIT[6:0] may be designed according to various requirements. For example, the initial reference currents IREF_INIT[6:0] may be 1 uA, 2 uA, . . . , 64 uA. However, the initial reference currents IREF_INIT[6:0] are not limited to fixed steps of 1 uA, and are not limited to the order of microamperes. Fixed steps or variable steps may be utilized according to different requirements. Also, range and number of the initial reference currents IREF_INIT may be increased or decreased.

In the above description of the process 20, the initial reference current IREF_INIT is not reset each time the process 20 moves to a subsequent address PA[17:0]. In another embodiment, the process 20 is modified to reset the initial reference current IREF_INIT to IREF_INIT[6:0]=0 before each cell is tested. The initial reference current IREF_INIT for each cell may be stored. Thus, the distributions 111-113 shown in FIG. 2 may be stored for the die, and the six different currents may be calculated or looked up based on a statistical measure of the corresponding distribution. For example, a mean of the distribution 111 may be utilized to determine the six different currents for the negative corner process. A median, mode, or other statistical measure may also be utilized to determine the six different currents for each process corner based on each distribution 111-113.

It should be noted that the erase verify current EV2 is only used for the process 20 as an example. In another embodiment, all cells of the die may be programmed to "0", and the program verify current PV2 may be utilized to find an initial reference current IREF_INIT. For example, a maximum initial reference current IREF_MAX may be utilized initially to test for a programmed state "00". The initial reference current IREF_INIT may then be decremented until the programmed state "00" is not read. In this way, a minimum on current Ion_min may be determined for the die, and the six different currents may be calculated or looked up based on the minimum on current Ion_min. Or, as described above, entire distributions 101-103 may be stored, and a statistical measure of the program verify current PV may be utilized as a basis for determining the seven different currents.

It should be noted that although the above discussion of the process 20 is directed to trimming of reference currents IREF for different testing modes, the same process 20 is also applicable for trimming of gate voltage Vgs applied to the different testing modes.

Referring again to FIG. 3, the flash memory device 30 comprises the array of memory cells 300, the fuse sector 301, a read circuit 310, an auto-trimming circuit 320 configured for performing the process 20, a lookup table 330, and an offset calculation circuit 340. Only one die is shown in FIG. 3, but the flash memory device 30 may be extended to an array of dies, each comprising the above elements. As described above, the offsets may be stored in the lookup table 330. The offsets may also be calculated by the offset calculation circuit 340. Thus, either the lookup table 330 or the offset calculation circuit 340 may be optional. The auto-trimming circuit 320 is coupled to the read circuit 310 for receiving the erase state (or program state) read from the memory cell under test. The auto-trimming circuit 320 is also coupled to the fuse sector 301 for programming the fuse sector 301 with the reference current settings IREF_SET according to the offsets received from the lookup table 330 or the offset calculation circuit 340. The auto-trimming circuit 320 may output the current initial reference current IREF_INIT after all cells have been tested or the maximum initial reference current IREF_MAX to the offset calculation circuit 340 or the lookup table 330, and the offset calculation circuit 340 or the lookup table 330 may output the offsets to the auto-trimming circuit 320 accordingly. The auto-trimming circuit 320 may sum the current initial reference current IREF_INIT after all cells have been tested or the maximum initial reference current IREF_MAX with the offsets received to generate the reference current settings IREF_SET, then program the reference current settings IREF_SET to the fuse sector 301. To perform the process 20, the auto-trimming circuit 320 may comprise an address counter module for performing Step 204, and a current control module for controlling the initial reference current IREF_INIT (Step 202). The auto-trimming circuit 320 may further comprise a register for storing an input characteristic. The input characteristic is a reference current applied to a predetermined test mode in some embodiments. For example, the input characteristic may be the initial reference current IREF_INIT. When the process 20 is completed, the register may store the maximum off current Ioff_max or the minimum on current Ion_min corresponding to how the process 20 is performed (based on the erase verify current EV2 or on the program verify current PV).

The fuse sector 301 comprises flash memory cells, such as SONOS (Silicon-Oxide-Nitride-Oxide-Silicon) memory cells, which may lose charge during test procedures. Thus, the flash memory device 30 may further comprise a register 350. After powering up the flash device 30, fuse bits of the fuse sector 301 may be loaded to the register 350. Then, after certain test procedures, such as baking, the fuse bits stored in the register 350, e.g. the trimming bits, may be written back to the fuse sector 301 again to compensate for charge loss. This write-back procedure is realized by an auto-refresh circuit comprised by the flash device 30 for writing back the trim codes to the fuse sector in some embodiments.

Because each die of a flash memory device comprises an auto-trimming circuit, such as the auto-trimming circuit 320 described above, auto-trimming may be accomplished rapidly. Further, each die is optimized for program verify and/or erase verify reference current IREF or cell gate-source voltage Vgs, which improves reliability.

Those skilled in the art will readily observe that numerous modifications and alterations of the device and method may be made while retaining the teachings of the invention.

What is claimed is:

1. A flash memory device with auto-trimming functionality, the flash memory device comprising:
a memory cell array comprising:
a plurality of first memory cells; and
a fuse sector comprising a plurality of second memory cells;
a read circuit electrically connected to the plurality of first memory cells for reading a memory state of the plurality of first memory cells; an offset circuit for outputting offset current values according to an input current value; and
an auto-trimming circuit comprising:
a register for storing a current characteristic;
a current control module for modifying an input current applied to a first memory cell of the plurality of first memory cells under test at a first address according to the memory state, and updating the current characteristic to the modified input current;
an address counter for starting application of the modified input current to a second memory cell of the plurality of first memory cells at a second address for test when reading the first memory cell passes; and
a programming circuit for transmitting the current characteristic to the offset circuit when the current control module updates the current characteristic to a limit input current or the plurality of memory cells has been read, receiving the offset current values from the offset circuit, and programming the fuse sector according to the current characteristic and the offset current values.

2. The flash memory device of claim 1, wherein the plurality of first memory cells are in a predetermined state.

3. The flash memory device of claim 2, wherein the predetermined memory state is the erased state.

4. The flash memory device of claim 3, wherein the current control module increases the input current until read pass occurs.

5. The flash memory device of claim 2, wherein the predetermined memory state is the programmed state.

6. The flash memory device of claim 5, wherein the current control module decreases the input current until read pass occurs.

7. The flash memory device of claim 1, wherein the offset circuit is an offset calculation circuit for calculating the offset current values according to the input current value.

8. The flash memory device of claim 1, wherein the offset circuit is a lookup table storing pluralities of offset current values corresponding to a plurality of input current values.

9. A method of setting trim codes for a flash memory device, the method comprising:
setting a plurality of memory cells of the flash memory device to an initial state;
applying an input current to a first memory cell of the plurality of memory cells at a first address;
modifying the input current until read pass occurs under the initial state;
updating a current characteristic with the first input current each time the input current is modified; and
setting the trim codes according to the current characteristic when all memory cells of the plurality of memory cells have been read.

10. The method of claim 9, wherein setting the plurality of memory cells of the flash memory device to the initial state is setting the plurality of memory cells of the flash memory device to an erased state.

11. The method of claim 10, wherein modifying the input current until read fail occurs under the initial state is increasing the input current until read pass occurs.

12. The method of claim 9, wherein setting the plurality of memory cells of the flash memory device to the initial state is setting the plurality of memory cells of the flash memory device to a programmed state.

13. The method of claim 12, wherein modifying the input current until read pass occurs under the initial state is decreasing the input current until read pass occurs.

14. The method of claim 9, wherein setting the trim codes according to the current characteristic when all memory cells of the plurality of memory cells has been read comprises:
sending the current characteristic to an offset circuit;
outputting offset current values according to the current characteristic; and
setting the trim codes according to the offset current values.

15. The method of claim 14, wherein the step of outputting the offset current values according to the current characteristic further comprises the step of calculating the offset current values according to the current characteristic.

16. The method of claim 14, wherein the step of outputting the offset current values according to the current characteristic further comprises the step of looking up the offset current values according to the current characteristic.

17. A flash memory device with auto-trimming functionality, the flash memory device comprising:
a memory cell array comprising:
a plurality of memory cells; and
a fuse sector;
a read circuit electrically connected to the plurality of first memory cells for reading the plurality of memory cells and outputting a cell distribution; and
an auto-trimming circuit for modifying a current characteristic according to the cell distribution and outputting a plurality of trim codes to the fuse sector according to the current characteristic and a plurality of offset current values.

18. The flash memory device of claim 17 further comprises an offset circuit for outputting the plurality of offset current values according to the input characteristic.

19. The flash memory device of claim 17, wherein the plurality of memory cells are fully erased.

20. The flash memory device of claim 17, wherein the plurality of memory cells are fully programmed.

21. The flash memory device of claim 17, wherein the plurality of trim codes are related a plurality of read conditions under test.

22. The flash memory device of claim 17, wherein the input characteristic is a reference current applied to a predetermined test mode.

23. The flash memory device of claim 22, wherein the predetermined test mode is erase mode verify.

24. The flash memory device of claim 22, wherein the predetermined test mode is program verify (PV).

25. The flash memory device of claim 17, wherein the input characteristic is a gate voltage to a predetermined test mode.

26. The flash memory device of claim 25, wherein the predetermined test mode is erase mode verify.

27. The flash memory device of claim 25, wherein the predetermined test mode is program verify (PV).

28. The flash memory device of claim 17, further comprising an auto-refresh circuit for writing back the trim codes to the fuse sector.

\* \* \* \* \*